US010840288B2

(12) United States Patent
Sato (10) Patent No.: US 10,840,288 B2
(45) Date of Patent: Nov. 17, 2020

(54) IMAGING DEVICE, IMAGING APPARATUS, AND IMAGE INPUT DEVICE (71) Applicant: Koichi Sato, Tokyo (JP)

(72) Inventor: Koichi Sato, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 16/104,368

(22) Filed: Aug. 17, 2018

(65) Prior Publication Data
US 2019/0088706 A1 Mar. 21, 2019

(30) Foreign Application Priority Data
Sep. 21, 2017 (JP) ................. 2017-181731

(51) Int. Cl.
H01L 27/146 (2006.01)
H01L 31/0224 (2006.01)
H01L 31/0336 (2006.01)
G01C 3/08 (2006.01)
H01L 31/109 (2006.01)
H01L 31/032 (2006.01)
H01L 31/0216 (2014.01)
H01L 31/09 (2006.01)
H04N 5/378 (2011.01)
H04N 5/363 (2011.01)

(52) U.S. Cl.
CPC ......... H01L 27/14643 (2013.01); G01C 3/08 (2013.01); H01L 27/1462 (2013.01); H01L 27/14612 (2013.01); H01L 27/14636 (2013.01); H01L 27/14665 (2013.01); H01L 31/02161 (2013.01); H01L 31/022475 (2013.01); H01L 31/0322 (2013.01); H01L 31/0336 (2013.01); H01L 31/09 (2013.01); H01L 31/109 (2013.01); H04N 5/363 (2013.01); H04N 5/378 (2013.01)

(58) Field of Classification Search
CPC .......... H01L 27/14612; H01L 27/1462; H01L 27/14636; H01L 27/14643; H01L 31/022475; H01L 31/0336
USPC ................................. 257/444–448
See application file for complete search history.

(56) References Cited

U.S. PATENT DOCUMENTS

2011/0216212 A1* 9/2011 Watanabe ............ H04N 5/2353
348/222.1
2012/0025061 A1* 2/2012 Izuha ................... H04N 5/3698
250/208.1
2016/0126275 A1* 5/2016 Kurokawa ........ H01L 27/14643

FOREIGN PATENT DOCUMENTS

JP 2006-032913 2/2006
JP 2016-033983 3/2016
(Continued)

Primary Examiner — Brook Kebede
(74) Attorney, Agent, or Firm — Oblon, McClelland, Maier & Neustadt, L.L.P.

(57) ABSTRACT

An imaging device, an imaging apparatus, and an image input device. The imaging device includes a plurality of pixels disposed on a semiconductor substrate, and each of the pixels includes a photoelectric converter. The photoelectric converter includes a photoelectrically converting layer configured to convert incident light into a signal charge, a transparent electrode disposed on the photoelectrically converting layer, a protective layer disposed under the photoelectrically converting layer, an insulating layer disposed under the protective layer, and a pixel electrode disposed under the insulating layer. The imaging apparatus includes the imaging device. The image input device includes the imaging device.

12 Claims, 7 Drawing Sheets (56) References Cited

FOREIGN PATENT DOCUMENTS

| WO | WO2012/004923 A1 | | 1/2012 | | |
|---|---|---|---|---|---|
| WO | WO-2012004923 A1 | * | 1/2012 | ......... | H01L 27/1461 |

* cited by examiner

IMAGING DEVICE, IMAGING APPARATUS, AND IMAGE INPUT DEVICE

CROSS-REFERENCE TO RELATED APPLICATION

This patent application is based on and claims priority pursuant to 35 U.S.C. § 119(a) to Japanese Patent Application No. 2017-181731, filed on Sep. 21, 2017, in the Japan Patent Office, the entire disclosure of which is hereby incorporated by reference herein.

BACKGROUND

Technical Field

Embodiments of the present disclosure relate to an imaging device, an imaging apparatus, and an image input device.

Background Art

As imaging devices used for an image sensor of a camera or the like, metal-insulator semiconductor (MIS) imaging devices, where an insulating layer is formed on a semiconductor and metal is laminated on top of that semiconductor, are known in the art. In some of such imaging devices, a photoelectrically converting layer (photoelectrically converting film) is used for a photoelectric converter. For example, a transparent electrode is disposed on a photoelectrically converting layer (photoelectrically converting film), and a pixel electrode is disposed under the photoelectrically converting layer. Moreover, an insulating layer is disposed between the photoelectrically converting layer and the pixel electrode.

As a predetermined level of voltage is applied to the transparent electrode, the photoelectrically converting layer accumulates an electrical charge according to the amount of received light. By contrast, as a voltage whose level is higher than the above predetermined level is applied to the transparent electrode, the electrical charge that is accumulated in the photoelectrically converting layer is ejected to the transparent electrode, and the photoelectrically converting layer is completely depleted. As an electrical charge is accumulated in the photoelectrically converting layer and then the photoelectrically converting layer is completely depleted, correlated double sampling (CDS) is performed. As a result, a kT/C noise (reset noise) can be removed. Alternatively, some imaging devices are known in the art in which the photoelectrically converting layer has a quantum dot structure to attenuate the defective state density of the photoelectrically converting layer.

SUMMARY

Embodiments of the present disclosure described herein provide an imaging device, an imaging apparatus, and an image input device. The imaging device includes a plurality of pixels disposed on a semiconductor substrate, and each of the pixels includes a photoelectric converter. The photoelectric converter includes a photoelectrically converting layer configured to convert incident light into a signal charge, a transparent electrode disposed on the photoelectrically converting layer, a protective layer disposed under the photoelectrically converting layer, an insulating layer disposed under the protective layer, and a pixel electrode disposed under the insulating layer. The imaging apparatus includes the imaging device. The image input device includes the imaging device.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

In the following description, a digital camera according to an embodiment of the present disclosure is described with reference to the drawings.

Figure 1:
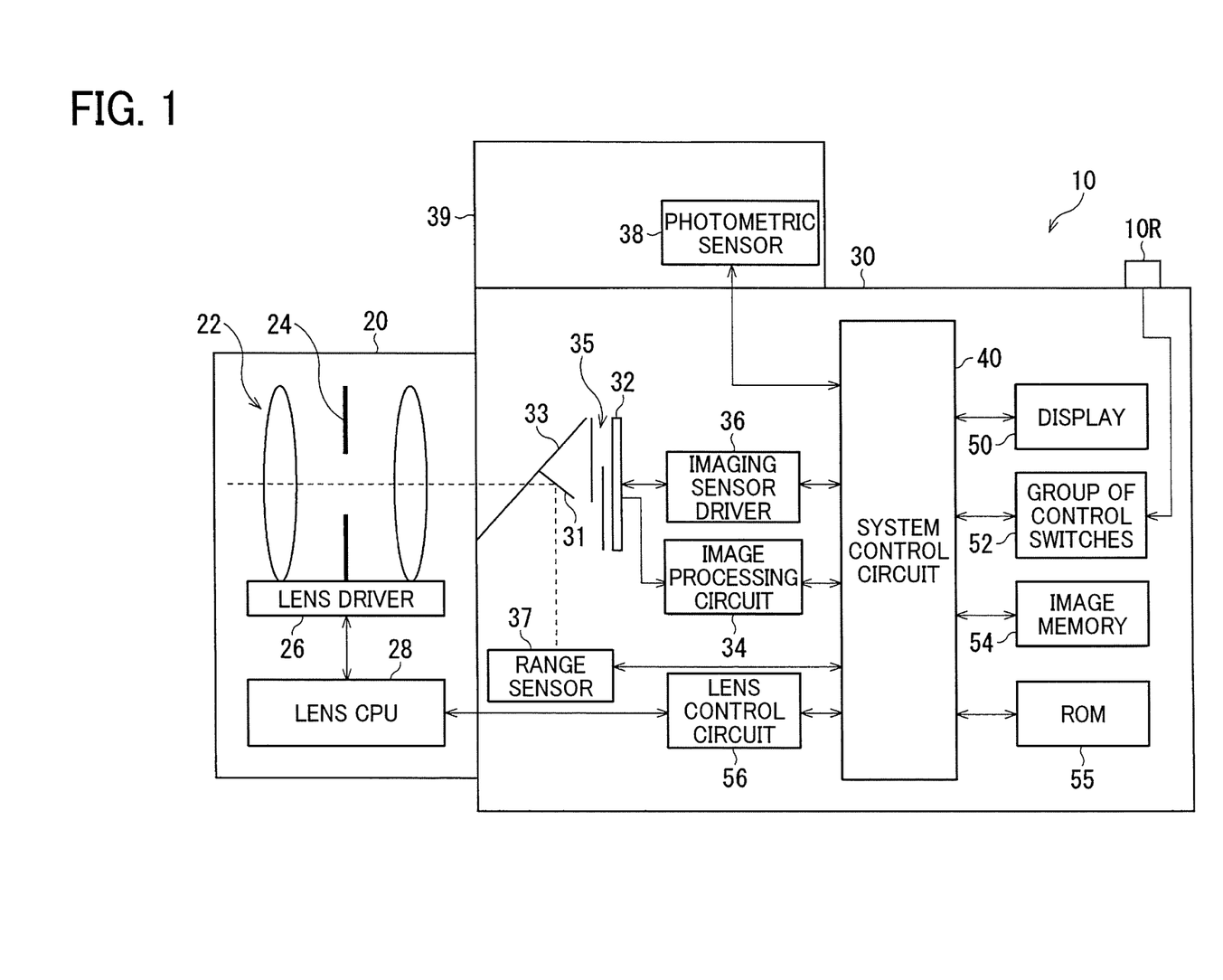
FIG. 1 is a block diagram of a digital camera according to an embodiment of the present disclosure.

FIG. 1 is a block diagram of a digital camera 10 according to the present embodiment.

In the present embodiment, the digital camera 10 is configured as a single-lens reflex digital camera, and is provided with a main unit 30 of the camera, and an interchangeable lens 20 that is detachable from the main unit 30 of the camera. The main unit 30 of the camera is provided with a group of control switches 52 including, for example, a power switch, a capturing switch, and a capture mode selecting switch. The interchangeable lens 20 includes a capturing optical system 22 and a lens stop 24 that are held in a movable manner in the optical-axis direction.

A system control circuit 40 that is provided with a camera central processing unit (CPU) as well as, for example, a read only memory (ROM), a random access memory (RAM), and a communication interface circuit outputs a control signal to, for example, a lens control circuit 56 and an image processing circuit 34 in accordance with input operation made to a shutter-release button 10R or the like, and controls the overall operation of the camera including, for example, the exposure control and recording operation of the camera. A program for controlling the operation of the camera is stored in a storage medium such as a ROM 55.

In a capture mode, the light that is reflected from an object and has passed through the capturing optical system 22 is guided to a viewfinder 39 by a movable mirror 33. A user can visually recognize the object through the viewfinder 39. When the group of control switches 52 detect that the shutter-release button 10R is pressed halfway down, the focus of the eye is adjusted.

The object light enters a distance-measuring sensor 37 as reflected by a half mirror 31 attached to the movable mirror 33, and the amount of defocusing is calculated and obtained based on the brightness signal output from the distance-measuring sensor 37.

A lens central processing unit (CPU) 28 controls a lens driver 26 based on the instructions given from the lens control circuit 56 of the main unit 30 of the camera. The lens driver 26 controls the focusing lens of the capturing optical system 22 to move in the optical-axis direction, in accordance with a control signal given from the lens CPU 28. On the other hand, a photometric sensor 38 provided within the viewfinder 39 detects the brightness of an object when the shutter-release button 10R is pressed halfway down, and transmits the brightness data to a system control circuit 40. The system control circuit 40 calculates and obtains an exposure value (such as the shutter speed, f number, and the sensitivity), and adjusts the operation setting of the camera.

When the shutter-release button 10R is pressed all the way down, a movable mirror 33 (including the half mirror 31) is moved away from the optical path, and the shutter 35 and the lens stop 24 are driven independently due to the exposure control by the system control circuit 40. Accordingly, the light beam that has passed through the capturing optical system 22 forms an image at the imaging sensor 32, and an object image is formed at the imaging sensor 32.

In the present embodiment, the imaging sensor 32 is configured by a complementary metal oxide semiconductor (CMOS) solid-state image sensing device and its associated circuitry, and M pixels and N pixels are arranged in square in the horizontal direction and the vertical direction of the imaging sensor 32, respectively. The imaging sensor 32 is configured as a single-panel color image sensor, and for example, a primary-color on-chip mosaic filter array is disposed in a Bayer pattern.

An imaging sensor driver 36 drives the imaging sensor 32 so as to read a pixel signal of one frame from the imaging sensor 32. The read pixel signal is analog-to-digital (A/D) converted by the imaging sensor driver 36, and then is sent to the image processing circuit 34. The image processing circuit 34 performs, for example, color interpolation processes, gamma correcting processes, and white balance controlling processes on the read and obtained pixel signal of one frame, to generate still image data.

The generated still image data is stored in an image memory (such as a memory card) 54 in a compressed or not compressed state. A display 50 such as a liquid crystal display (LCD) displays, for example, the information about the capture mode, a preview image when an image is to be captured, an image to be checked after the image has been captured, and an image reproduced in a reproduction mode.

Figure 2:
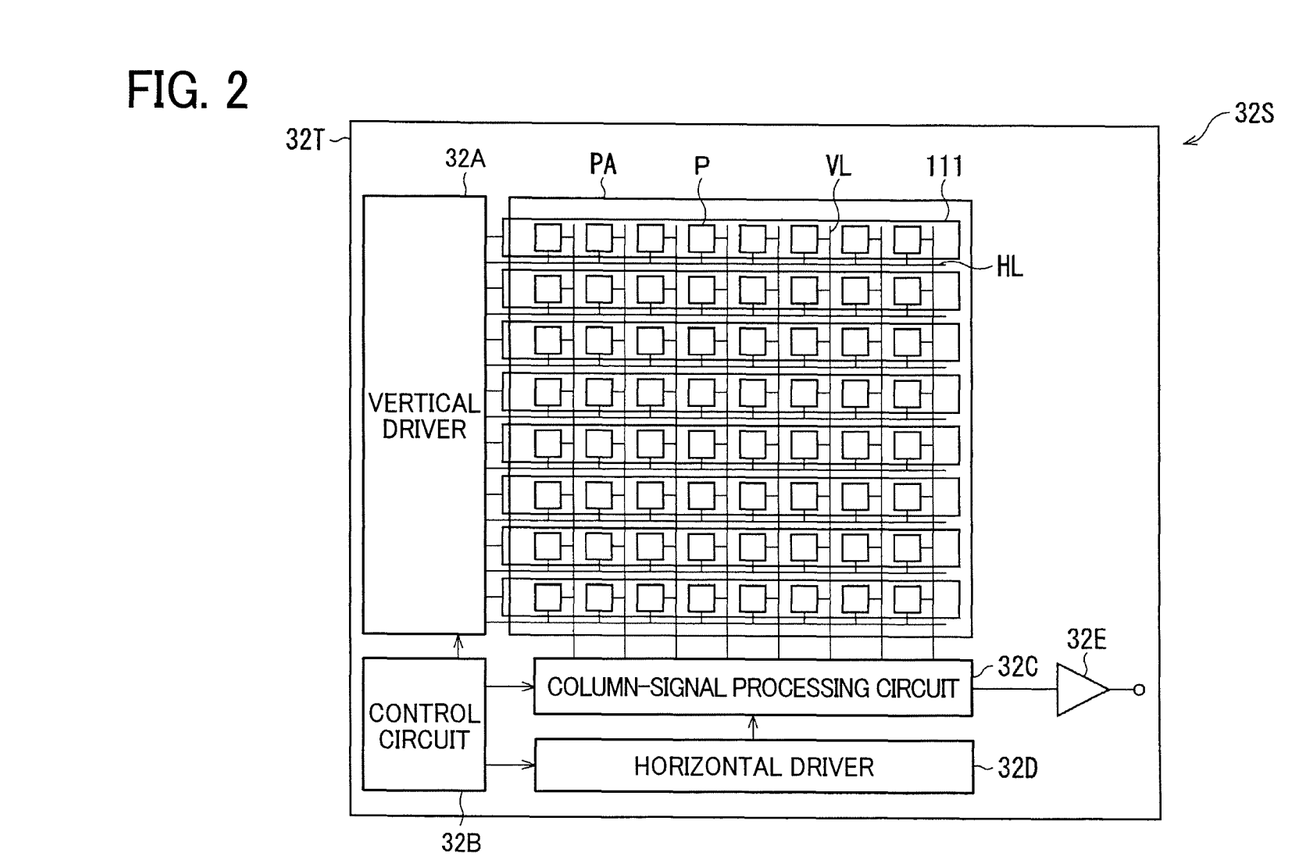
FIG. 2 is a schematic diagram illustrating a configuration of a solid-state image sensing device used for an imaging sensor, according to an embodiment of the present disclosure.

FIG. 2 is a schematic diagram illustrating a configuration of a solid-state image sensing device used for the imaging sensor 32, according to the present embodiment. Note that this solid-state image sensing device may be referred to simply as an imaging device in the following description. Note that the photometric sensor 38 also adopts a similar image sensing device.

In an imaging device 32S, a pixel area PA where a plurality of pixels P are arranged in a matrix is formed on a substrate 32T made of silicon (Si), and a vertical driver 32A, a control circuit 32B, a column-signal processing circuit 32C, a horizontal driver 32D, and an output circuit 32E are disposed around the pixel area PA. Each of the pixels P is provided with a photoelectric converter and a plurality of transistors (such as a transferring transistor, a resetting transistor, a selecting transistor, and an amplifying transistor). A plurality of strip-shaped transparent electrodes 111, which extend in the row direction, are formed on a row-by-row basis, and each of the rows is insulated.

The pixel area PA where a plurality of pixels P are regularly arranged in a matrix includes an effective pixel area in which the incident light is photoelectrically converted and the generated signal charge is amplified to output the amplified signal charge to the column-signal processing circuit 32C, and a black reference-pixel area in which signal charge is output to provide a standard of black level. In the present embodiment, the black reference-pixel area is disposed around the effective pixel area. In FIG. 2, the pixel area PA indicates the effective pixel area.

The control circuit 32B generates, for example, a clock signal and a control signal based on, for example, a vertical synchronizing signal, a horizontal synchronizing signal, and a master clock signal, and outputs the generated clock signal and control signal to the vertical driver 32A, the column-signal processing circuit 32C, and the horizontal driver 32D. The vertical driver 32A, the column-signal processing circuit 32C, and the horizontal driver 32D operate in accordance with the received clock signal and control signal.

For example, the vertical driver 32A is configured by a shift register, and sequentially scans each of the pixels P in the vertical direction on a row-by-row basis through a horizontal control line HL, in a selective manner. More specifically, the vertical driver 32A generates a pixel electrode reset signal, a signal charge reset signal, and a row selection signal, and supplies the column-signal processing circuit 32C with a pixel signal through a vertical signal line VL. The pixel signal is generated based on the signal charge generated according to the amount of light received by each of the pixels P.

For example, the column-signal processing circuit 32C may be provided for each row of pixels, and includes a correlated double sampling (CDS) circuit. Based on a pixel signal sent from the pixels in the black reference-pixel area, the column-signal processing circuit 32C removes noise such as a reset noise from the input pixel signal of one row (noise reduction), or amplifies the input pixel signal of one row (signal amplification), for each row of pixels. The CDS circuit performs correlated double sampling (CDS) on the signal charge output from the vertical signal line VL, for each row of pixels.

For example, the horizontal driver 32D is configured by a shift register, and sequentially outputs horizontal scanning pulses. Due to this configuration, one of the multiple column-signal processing circuits 32C is sequentially selected, and the horizontal driver 32D controls each of the column-signal processing circuit 32C to output a pixel signal to the output circuit 32E. Then, the output circuit 32E outputs the pixel signal sent from the column-signal processing circuit 32C. As a result, a pixel signal is read from the imaging sensor 32.

Figure 3:
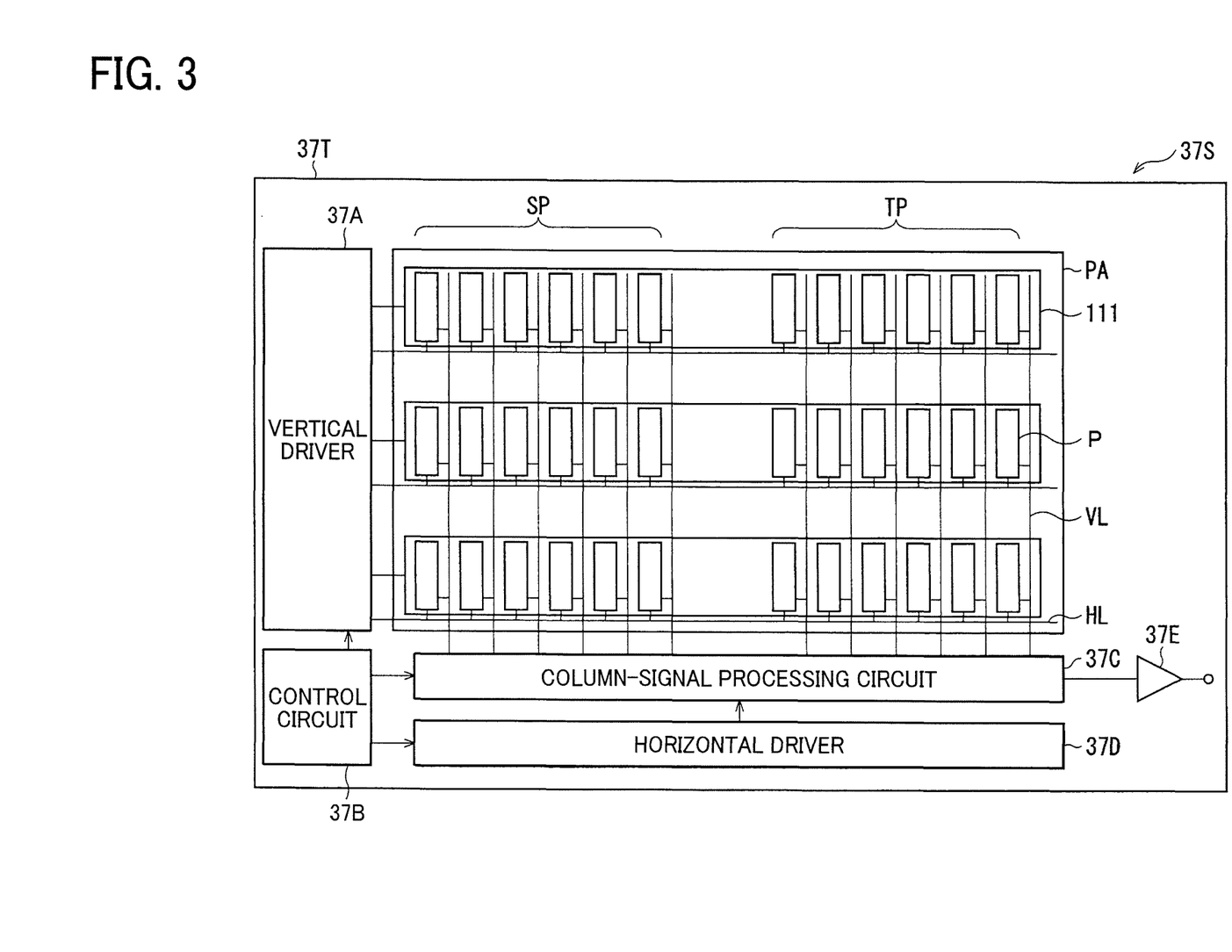
FIG. 3 is a schematic diagram illustrating a configuration of a solid-state image sensing device used for a distance-measuring sensor, according to an embodiment of the present disclosure.

FIG. 3 is a schematic diagram illustrating a configuration of a solid-state image sensing device used for the distance-measuring sensor 37, according to the present embodiment.

On a silicon substrate 37T of a solid-state image sensing device 37S, a base pixel array SP and a reference pixel array TP are arranged in opposite directions. The solid-state image sensing device 37S is configured like a line sensor, and receives the light upon forming a pupil-divided optical image that has passed through the capturing optical system 22 on the base pixel array SP and the reference pixel array TP that are arranged in the same line. Then, the focal point is detected upon calculating the amount of focal misalignment (i.e., the amount of defocusing) of a lens based on a phase shift of pixel signals.

The configuration and operation of elements such as a vertical driver 37A, a control circuit 37B, a column-signal processing circuit 37C, a horizontal driver 37D, and an output circuit 37E are substantially the same as the solid-state image sensing device 32S as illustrated in FIG. 2. In a similar manner to the imaging sensor 32 as illustrated in FIG. 2, a plurality of transparent electrodes 111, each of which is coupled to the vertical driver 37A, are arranged on a row-by-row basis.

Figure 4:
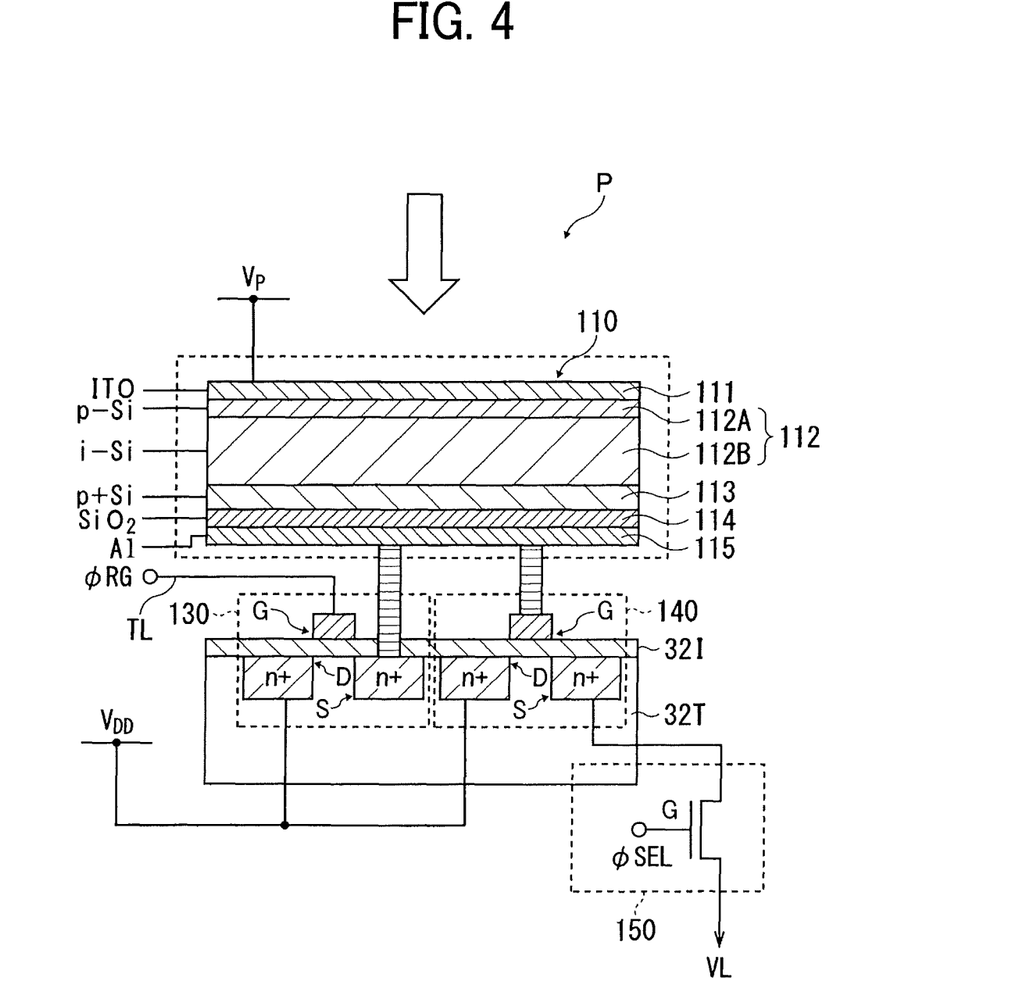
FIG. 4 is a schematic sectional view of a specific pixel, according to an embodiment of the present disclosure.

FIG. 4 is a schematic sectional view of a specific pixel P, according to the present embodiment.

The pixel P is provided with a photoelectric converter 110 that converts the incident light into an electrical-charge signal, a pixel electrode 115, a resetting transistor 130, an amplifying transistor 140, and a selecting transistor 150. In the photoelectric converter 110, the transparent electrode 111 as described above, a photoelectrically converting layer (photoelectrically converting film) 112, a protective layer 113, an insulating layer 114, and a pixel electrode 115 are stacked on top of each other in the order listed.

In the present embodiment, the transparent electrode 111 is configured by an indium-tin oxide (ITO). However, no limitation is indicated thereby, and for example, zinc oxide (ZnO) may be used instead. The photoelectrically converting layer 112 that is made of silicon crystal includes a p-type silicon layer (p-Si) 112A and an i-type silicon layer (i-Si) 112B with no impurity. In the present embodiment, the photoelectrically converting layer 112 is integrated on a row-by-row basis, and is electrically isolated from another photoelectrically converting layer 112 in a neighboring row.

The protective layer 113 is configured by a p-type silicon layer (p+Si). Moreover, the protective layer 113 has electrical charge that is opposite in polarity with reference to the signal charge that is generated and accumulated by the photoelectric converter 110, and such electrical charge of the protective layer 113 is of higher concentration and functions as majority carrier. In the present embodiment, the insulating layer 114 is made of silicon dioxide ($SiO_2$), and the pixel electrode 115 is configured by aluminum (Al). Alternatively, the insulating layer 114 may be configured by silicon mononitride (SiN) or silicon nitride ($Si_3N_4$).

In the present embodiment, the resetting transistor 130 is configured as a metal oxide semiconductor (MOS) transistor, and a certain level of voltage Vdd is applied to the drain D. The source S of the resetting transistor 130 is coupled to the pixel electrode 115, and the gate G of the resetting transistor 130 is coupled to the wiring TL for resetting the pixel electrode 115. The resetting transistor 130 resets the voltage of the pixel electrode 115 to predetermined voltage Vdd.

In the present embodiment, the amplifying transistor 140 is configured as a metal oxide semiconductor (MOS) transistor, and a certain level of voltage Vdd is applied to the drain D. The source S of the amplifying transistor 140 is coupled to the drain D of the selecting transistor 150, and the gate G of the insulating layer 321 is coupled to the pixel electrode 115. The amplifying transistor 140 amplifies the voltage of the pixel electrode 115 in a charge-accumulated state and the voltage of the pixel electrode 115 in a depleted state, and outputs the amplified voltage of the pixel electrode 115 in a charge-accumulated state and the amplified voltage of the pixel electrode 115 in a depleted state as the signal voltage and the noise voltage, respectively.

The gate G of the selecting transistor 150 is coupled to a pixel selection control signal line SEL, and the source S is coupled to the vertical signal line VL.

Figure 5:
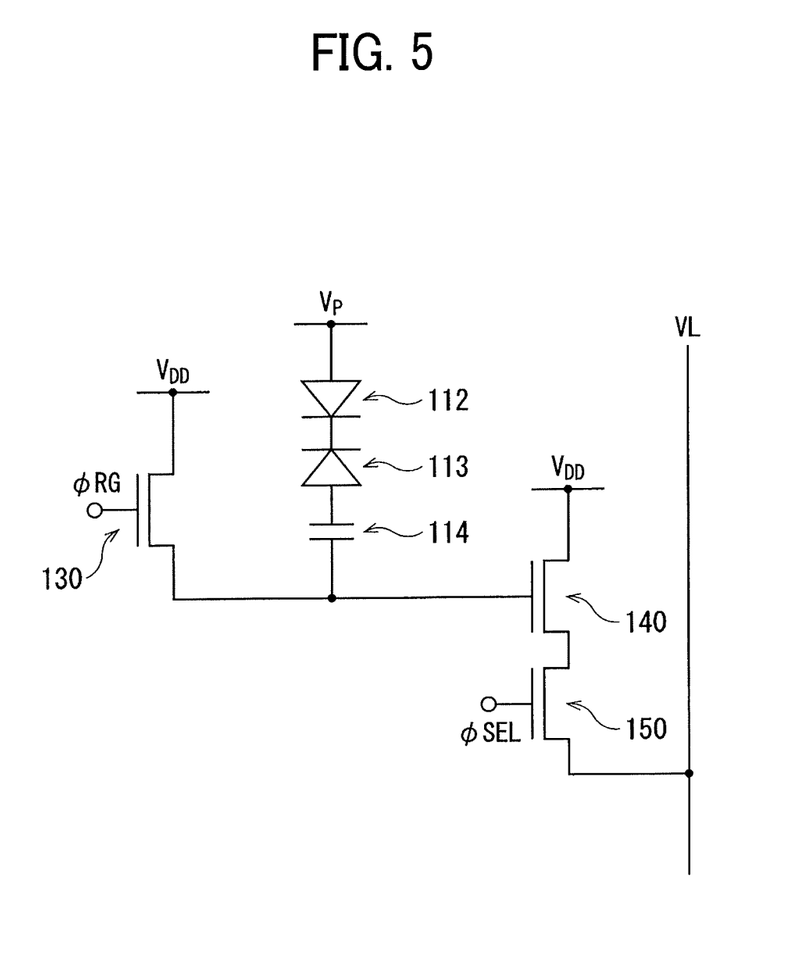
FIG. 5 is a diagram illustrating an equivalent circuit of a predetermined pixel, according to an embodiment of the present disclosure.

FIG. 5 is a diagram illustrating an equivalent circuit of a predetermined pixel P, according to the present embodiment.

Figure 6:
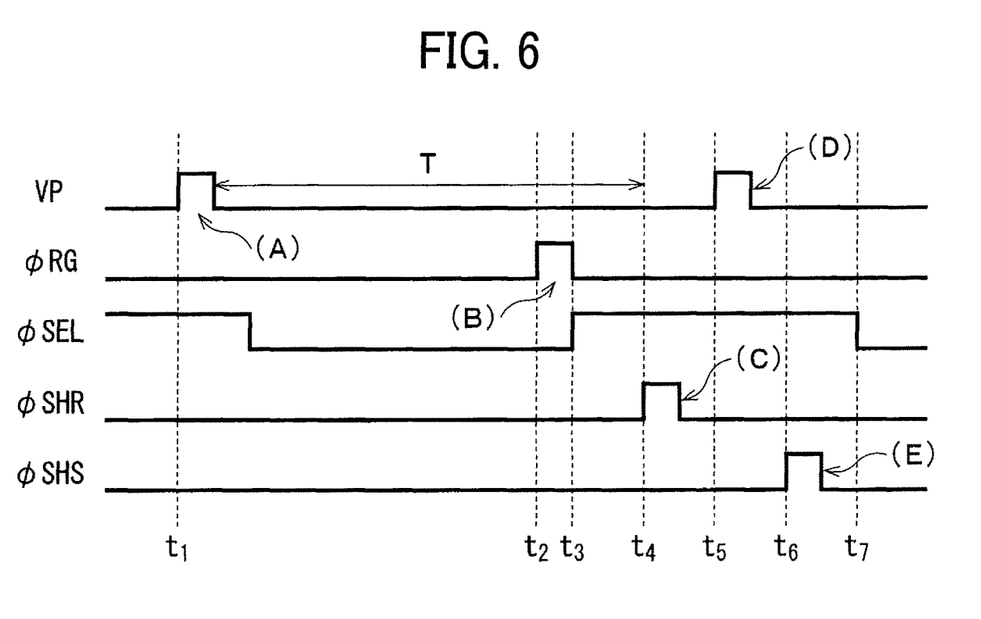
FIG. 6 is a drive timing chart for a predetermined pixel, according to an embodiment of the present disclosure.

FIG. 6 is a drive timing chart for a predetermined pixel P, according to the present embodiment.

With reference to FIG. 5 and FIG. 6, the operation from the accumulation to the ejection of the signal charge in the pixel P is described.

When a certain level of high voltage is applied to the transparent electrode 111 at time t1, the photoelectrically converting layer 112 is reset (see (A) in FIG. 6). As a result, the accumulated charge is completely ejected, and then the electrical charge caused by the photoelectric conversion is accumulated. As illustrated in FIG. 5, the protective layer 113 is indicated by a diode in an equivalent circuit. At a time t2, the pixel electrode 115 is reset. Accordingly, a certain level of voltage is applied to the gate G of the resetting transistor 130 (see (B) in FIG. 6).

When the reset operation is completed (at time t3), the control signal voltage of the selecting transistor 150 is set to a high voltage. As a result, the signal voltage of the pixel electrode 115 is output from the amplifying transistor 140 through the vertical signal line VL. After that, at the timing of time t4, the signal voltage is read out to the column-signal processing circuit 32C (see (C) in FIG. 6). Accordingly, the interval between t1 to t4 is equivalent to a charge-accumulating time T on the photoelectrically converting layer 112.

After the signal voltage is read (time t5), the voltage that is applied to the transparent electrode 111 is again set to a high voltage (see (D) in FIG. 6). As a result, the accumulated signal charge is ejected to the transparent electrode 111, and the photoelectrically converting layer 112 is depleted and all the signal charge is gone from the photoelectrically converting layer 112.

At time 6, the voltage of the pixel electrode 115 with no accumulated charge, i.e., the noise voltage, is read out to the column-signal processing circuit 32C (see (E) in FIG. 6). The column-signal processing circuit 32C detects the difference between the previously-read signal voltage and the noise voltage. As a result, a signal can be obtained from which noise including a reset noise (kT/C noise) has been removed.

At time t7, the voltage level of the control signal of the selecting transistor 150 is switched to a low voltage, and the selecting operation for the pixel P ends. Such a series of operation is sequentially performed for each row, and an image is captured by a rolling shutter operation. Regarding the voltage applied to the transparent electrode 111, the voltage when the signal charge is accumulated may be set to a relatively high voltage, and the voltage when the electrical charge is ejected may be set to a relatively low voltage.

Figure 7A:
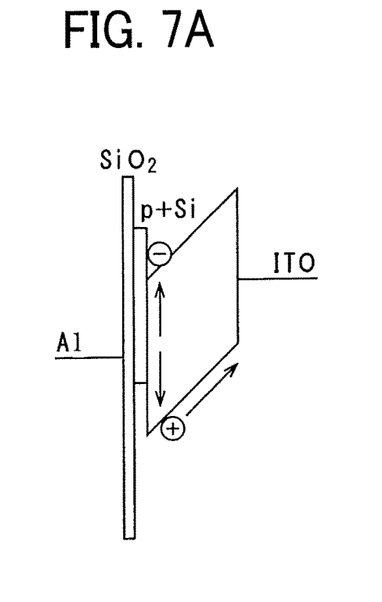
FIG. 7A and FIG. 7B are diagrams each illustrating an energy band of a photoelectric converter when a photoelectrically converting layer and a protective layer are made of a silicon semiconductor, according to an embodiment of the present disclosure.
Figure 7B:
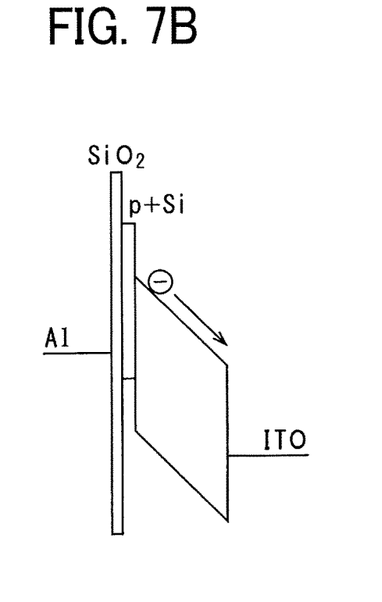

FIG. 7A and FIG. 7B are diagrams each illustrating an energy band of the photoelectric converter 110, according to the present embodiment.

More specifically, FIG. 7A and FIG. 7B illustrates a charge-accumulated state and a charge-depleted state of the photoelectric converter 110. The photoelectric conversion is performed when the transparent electrode 111 in a grounded (GND) state, and the signal charge caused to a non-doped silicon layer 112B (i-Si) is prevented from flowing into the pixel electrode 115 by the insulating layer 114. For this reason, the signal charge is accumulated on the silicon layer 112B (i-Si) (see FIG. 7A).

When a certain level of voltage is applied to the transparent electrode 111 in the above state, the accumulated charge of the silicon layer 112B (i-Si) is ejected to the transparent electrode 111 (see FIG. 7B). In the present embodiment, the photoelectrically converting layer 112 has an energy band where the electrical charge caused by the photoelectric conversion is accumulated when a certain level of voltage (first voltage) is applied thereto and the accumulated signal charge is completely ejected to the transparent electrode 111 when a voltage whose level is higher than the first voltage (second voltage) is applied thereto.

An interface state density exists in between the silicon layer 112B (i-Si) and the insulating layer 114. Due to this configuration, unnecessary electrical charge whose polarity is the same as the accumulated signal charge is caused (such unnecessary electrical charge will be referred to as noise charge in the following description). Such unnecessary electrical charge serves as a dark current, and affects noise reduction in the correlated double sampling (CDS). However, the protective layer 113, which is a semi-conducting layer, has electrical charge that is opposite in polarity with reference to the accumulated signal charge, and such electrical charge of the protective layer 113 is of higher concentration and functions as a carrier.

The noise charge immediately recombines with the electrical charge of the protective layer 113 that is opposite in polarity with reference to the noise charge, and ceases. As a result, the noise charge generated in the interface state density between the insulating layer 114 and the photoelectrically converting layer 112 is reduced.

As described above, the photoelectrically converting layer 112 has an energy band that achieves complete depletion by completely ejecting the accumulated signal charge to the transparent electrode 111. Due to this configuration, kT/C noise (reset noise) may be removed by performing correlated double sampling (CDS) upon reading the signal voltage and the noise voltage of the pixel electrode 115 before and after the accumulated charge is ejected. In particular, the protective layer 113 has electrical charge that is opposite in polarity with reference to the accumulated signal charge, and such electrical charge of the protective layer 113 is of higher concentration and functions as majority carrier. Due to this configuration, noise reduction can effectively be achieved.

As described above, according to the present embodiment, each of the multiple pixels P is provided with the photoelectric converter 110 in the imaging device 32S provided for the imaging sensor 32. The photoelectric converter 110 is provided with the transparent electrode 111, the photoelectrically converting layer 112, the protective layer 113, the insulating layer 114, and the pixel electrode 115, and these elements of the photoelectric converter 110 are stacked on top of each other in the order listed. Moreover, the protective layer 113 is configured by a silicon semiconductor, and has majority carriers of higher concentration that are opposite in polarity with reference to the signal charge that is accumulated on the photoelectrically converting layer 112.

In order to calculate and obtain an appropriate exposure value (such as the exposure time, f number, and the sensitivity) before the imaging sensor 32 starts main capturing operation, it is necessary for the photometric sensor 38 to detect the brightness of an object within a short period of time, and higher sensitivity is required for the photometric sensor 38 than the imaging sensor 32. In the present embodiment, a noise such as a reset noise (kT/C noise) can be detected with reliability by the correlated double sampling (CDS), and high sensitivity can be achieved. Accordingly, application to the photometric sensor 38 is more effective.

Before the distance-measuring sensor 37 starts main capturing operation, the distance to an object needs to be detected in a short time, and the focus of the eye needs to be adjusted. What is more, the distance-measuring sensor 37 that detects the distance to an object in view of the addition of the signals of neighboring pixels, like the photometric sensor 38, ends up with deterioration of resolution, i.e., reduction in the precision of focal-point detection. In the present embodiment, as noise reduction and high sensitivity can be achieved, application to the distance-measuring sensor 37 is more effective.

In the present embodiment, both the photoelectrically converting layer 112 and the protective layer 113 are configured by a silicon semiconductor. However, no limitation is indicated thereby, and the photoelectrically converting layer 112 and the protective layer 113 may be configured by other kinds of semiconductor. For example, compound semiconductor made of, for example, gallium arsenide (GaAs), or chalcopyrite compound semiconductor (such a semiconductor may be referred to as a CIGS compound semiconductor in the following description) is applicable.

Figure 8A:
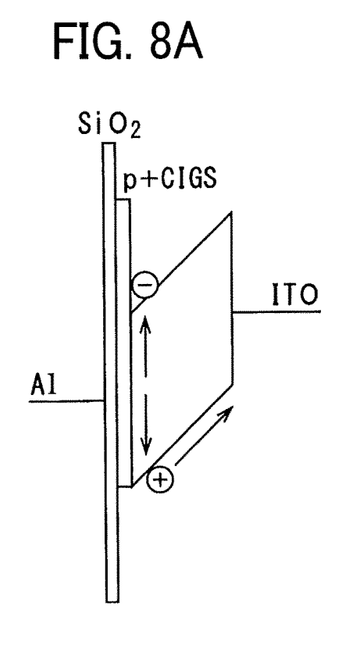
FIG. 8A and FIG. 8B are diagrams each illustrating an energy band of a photoelectric converter when a photoelectrically converting layer is made of a silicon semiconductor and a protective layer is made of a copper indium gallium selenide (CIGS) compound semiconductor, according to an embodiment of the present disclosure.
Figure 8B:
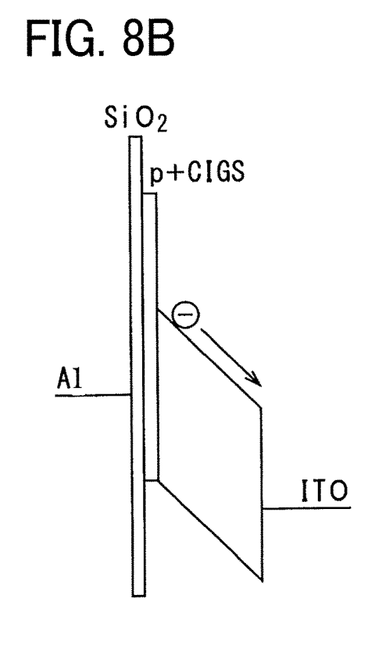

FIG. 8A and FIG. 8B are diagrams each illustrating an energy band of a photoelectric converter when the photoelectrically converting layer 112 is made of a silicon semiconductor and the protective layer 113 is made of a copper indium gallium selenide (CIGS) compound semiconductor, according to the present embodiment.

The lattice constant of the protective layer p+CIGS that is configured by a CIGS compound semiconductor may be matched to the lattice constant of the silicon layer i-Si (lattice matching), and the lattice constant of the protective layer p+CIGS can expand the energy-band gap. As such a copper indium gallium selenide (CIGS) compound semiconductor that can expand the energy-band gap, for example, a chalcopyrite compound semiconductor composed of, for example, a mixed crystal of copper (Cu)-aluminum (Al)-gallium (Ga)-indium (In)-sulfur (S)-selenium (Se) and a mixed crystal of copper (Cu)-aluminum (Al)-indium (In)-zinc (Zn)-sulfur (S)-selenium (Se) may be used.

In the present embodiment, each of the imaging sensor 32, the distance-measuring sensor 37, and the photometric sensor 38 is provided with the imaging device as described above. However, no limitation is indicated thereby, and only one of the imaging sensor 32, the distance-measuring sensor 37, and the photometric sensor 38 may be provided with the imaging device as described above, and how pixels are arranged is not limited to two-dimensional arrangement or arrangement in lines. The imaging device as described above may be applied to imaging devices other than digital cameras.

For example, the imaging device as described above may be applied to a camera module that is built into, for example, a mobile phone, an omnidirectional camera or spherical camera that can be provided for a vehicle such as a car, a camera used in, for example, a video-conference system and a security system, and the imaging device as described above may be applied to, for example, a position-detecting optical sensor and a distance-measuring sensor. Further, the imaging device as described above may be applied to imaging devices used for devices such as a facsimile (FAX) and a copier that have the function of reading images.

In short, the imaging device as described above is applicable to image input devices in general that photoelectrically convert the incident light and generate pixel data. The image input devices may perform signal processing on the read pixel signals, and may perform, for example, computations for image formation, image display, and measured value detection. Alternatively, the image input devices may transmit the image data obtained by the signal processing or other kinds of signals to, for example, an image forming apparatus and an image display apparatus. The pixel data that is read from an imaging device may simply be sent to another device or to the network.

Numerous additional modifications and variations are possible in light of the above teachings. It is therefore to be understood that within the scope of the appended claims, the disclosure of the present disclosure may be practiced otherwise than as specifically described herein. For example, elements and/or features of different illustrative embodiments may be combined with each other and/or substituted for each other within the scope of this disclosure and appended claims.

What is claimed is:

1. An imaging device comprising a plurality of pixels disposed on a semiconductor substrate, the plurality of pixels each including a photoelectric converter, the photoelectric converter comprising:
   a photoelectrically converting layer configured to convert incident light into a signal charge;
   a transparent electrode disposed on the photoelectrically converting layer;
   a protective layer disposed under the photoelectrically converting layer;
   an insulating layer disposed under the protective layer;
   a pixel electrode disposed under the insulating layer; and
   a resetting transistor configured to reset a voltage value of the pixel electrode to a power supply voltage ($V_{DD}$).

2. The imaging device according to claim 1, wherein the protective layer is made of a semi-conducting layer having an electrical charge that is opposite in polarity with reference to the signal charge generated by the photoelectrically converting layer.

3. The imaging device according to claim 1, wherein the protective layer and the photoelectrically converting layer are made of a silicon semiconductor.

4. The image input device according to claim 1, further comprising an amplifying transistor configured to amplify the voltage value of the pixel electrode.

5. The image input device according to claim 1, wherein the plurality of pixels include a first subset of pixels that generate output signals based on the incident light, and a second subset of pixels that output reference voltages indicative of circuit noise.

6. The image input device according to claim 5, further comprising a processing circuit configured to remove noise from the output signals of the first subset of pixels using the reference voltages of the second subset of pixels.

7. An imaging device comprising a plurality of pixels disposed on a semiconductor substrate, the plurality of pixels each including a photoelectric converter, the photoelectric converter comprising:
   a photoelectrically converting layer configured to convert incident light into a signal charge;
   a transparent electrode disposed on the photoelectrically converting layer;
   a protective layer disposed under the photoelectrically converting layer;
   an insulating layer disposed under the protective layer; and
   a pixel electrode disposed under the insulating layer
   wherein the photoelectrically converting layer is made of a silicon semiconductor,
   wherein the protective layer is made of a copper indium gallium selenide (CICS) compound semiconductor or a chalcopyrite compound semiconductor.

8. An imaging apparatus comprising the imaging device according to claim 7.

9. The imaging apparatus according to claim 8, further comprising at least one of a photometric sensor, and a distance-measuring sensor, and an imaging sensor including the imaging device.

10. An image input device comprising the imaging device according to claim 7.

11. The image input device according to claim 10, wherein signal processing is performed on a pixel signal read from the imaging device.

12. An imaging device comprising a plurality of pixels disposed on a semiconductor substrate, the plurality of pixels each including a photoelectric converter, the photoelectric converter comprising:
   a photoelectrically converting layer configured to convert incident light into a signal charge;
   a transparent electrode disposed on the photoelectrically converting layer;
   a protective layer disposed under the photoelectrically converting layer;
   an insulating layer disposed under the protective layer; and
   a pixel electrode disposed under the insulating layer,
   wherein the photoelectrically converting layer has an energy band in which a signal charge caused by photoelectric conversion is accumulated when a first voltage is applied to the transparent electrode, and a signal charge within the photoelectrically converting layer is completely ejected to the transparent electrode when a second voltage whose level is higher or lower than the first voltage is applied to the transparent electrode.

* * * * *